United States Patent Office 3,184,303

Patented May 18, 1965

3,184,303
SUPERCONDUCTIVE SOLDER

Allen W. Grobin, Jr., Stanfordville, N.Y., assignor to International Business Machines Corporation, New York, N.Y., a corporation of New York No Drawing. Filed Oct. 31, 1960, Ser. No. 65,920
2 Claims. (Cl. 75—134)

This invention relates to superconductive contacts and more particularly to a method of making superconductive contacts to thin films of superconductive material.

Thin films of superconducting material have recently been employed in the design of electrical circuits useful in large scale digital computers and other systems wherein their low cost, small size, and high reliability are advantageously utilized.

However, to obtain the advantages of superconductivity, most materials, as presently known, must be operated at extremely low temperatures extending to that at which helium liquifies, about 4.2° K. Since optimum superconductive circuits are formed of thin films deposited upon an insulating substrate, as shown in copending application Serial No. 625,512, filed November 30, 1956, on behalf of Richard L. Garwin, and assigned to the assignee of this invention, it has been difficult until now, to make electrical contacts to the necessary thin films and further to maintain electrical contact thereto at liquid helium temperature.

What has been discovered is a novel solder and soldering technique effective to form electrical contacts to thin films operative at liquid helium temperatures and further said contacts are themselves superconducting. Additionally, although the soldered connections, according to the present invention, have a temperature coefficient of expansion almost three times as great as the materials generally employed as substrates, the tensile stress encountered when the circuit is cooled to liquid helium temperatures is not sufficient to cause breakage of the substrate beneath the contact as is often encountered under contacts as previously formed. Finally, the contact of this invention may be reformed and repaired as convenient.

It is an object of the invention to provide a method of forming a superconductive contact.

Another object of the invention is to provide a method of soldering to thin metallic films.

Still another object of the invention is to provide a method of making contacts to thin metallic films operative at the temperature of liquid helium.

A further object of the invention is to provide a method of repairing thin film superconductive circuits.

A still further object of the invention is to provide a method of connecting thin superconductive films wherein the connection itself is superconducting.

A related object of the invention is to provide a method of forming electrical connections to non-conductive substrates.

Yet another object of the invention is to provide a method of interconnecting superconductive circuits.

The foregoing and other objects, features and advantages of the invention will be apparent from the following more particular description of a preferred embodiment of the invention.

In the fabrication of superconductive circuits, it has generally been the practice to provide a preformed substrate of glass or quartz upon which terminal contacts of silver have previously been applied by silk screening or similar processes. Next, various thin film layers of superconductive materials and insulators are deposited thereupon by means of the thermal evaporation of these materials within an evacuated chamber, the geometric configuration of each deposited layer being determined by a pattern defining mask. Portions of selected superconductive layers are deposited over, and contiguous with, the silver lands to which later are attached input and output connecting leads as well as other connections as required. However, difficulty has been encountered in forming these necessary connections to the thin films. Further, since superconductive circuits generally require at least two different superconductive materials, a first of which is chosen from the "hard" superconductive materials, that is, a material which remains superconducting when subjected to all values of circuit magnetic field, and a second of which is chosen from the "soft" superconductive materials, that is, a material which switches between the superconducting and resistive state when subjected to the circuit magnetic field, electrical connections between these materials are necessary. In general, the deposition of a second material over a portion of the area occupied by a first material has been employed to form these connections.

According to the method of the invention, however, connections to and between thin superconductive films are readily obtainable as well as to thin films deposited over silver lands, if necessary. Basically, the method includes a novel superconductive solder which exhibits completely unexpected characteristics at low temperatures. This solder includes tin, lead and indium, with the following interdependent limiting percentages, by weight:

Tin $\geqq$18% $\leqq$33% of lead-indium
Lead $\geqq$16% $\leqq$35%
Indium $\geqq$40% $\leqq$60%

It should be noted that when a superconductive solder as described above is also employed for soldering to silver lands, a portion of the silver dissolves into the solder causing the soldered connection to harden and to occasionally fracture when the circuit is cooled to liquid helium temperatures. This problem is overcome by adding a small amount of metallic silver to the solder described in this application, to thereby limit the amount of silver dissolving into and solidifying in the soldered connection, the amount of silver never exceeding 3% by weight. A preferred general purpose superconductive solder for soldering to thin superconducting films, to silver lands formed on soda-lime glass, fused quartz, and crystalline quartz substrates as well as directly to these substrates has the following composition, by weight:

| | Percent |
|---|---|
| Tin | 30 |
| Lead | 19 |
| Indium | 50 |
| Silver | 1 |

Silver, of course, is not necessary unless the solder is being employed to solder to silver lands. When silver is deleted from the general purpose superconductive solder, the lead content is increased to 20%.

The above solder is employed in the fabrication of superconductive circuits in the following manner. The required layers of superconductive materials and insulators are vacuum deposited upon a substrate in conventional manner, with the portions of the conductive layers to which input and output leads are to be connected extending into deposit free areas of the substrate. The general purpose superconductive solder is next employed in a soldering operation to attach the required input and output leads; 2 x 10 mil copper ribbon wire preferably being employed for the leads. Alternatively, a substrate having preformed silver lands may additionally be employed, as hereinbefore described, and the various materials deposited thereon. Next, a soldering operation employing the above defined general purpose superconductive solder is finally employed to attach input and output leads to the silver lands. Further, a combination of the above two procedures is used to connect a thin superconductive film to a silver land when the deposited film, itself, does not contact the land due to improper mask-substrate registration, a defective mask, a circuit defect, or a circuit change. This is accomplished by first making solder contact to the land and thence progressively forming a series of electrically conductive solder contacts to the substrate, preceding from the land towards the deposited film, until the film and land are electrically connected together. In this manner, a strong electrical and mechanical bond is attained, since the novel solder adheres as well to the glass or quartz substrate as to the silver land and film.

When conventional solders of the prior art are employed in a soldering operation to form contacts to thin superconducting films, it has been found that upon cooling the contact to liquid helium temperatures, a pocket of glass under the solder breaks away. It was first surmised that the heat employed during the soldering operation caused excessive stresses in the substrate, yet no areas of severe stresses were observed with a polariscope. Further, observation of numerous samples showed the fracture to be limited to the soldered area beneath the silver land, and that the broken away portions comprised solder, silver, and glass. Additionally, repeated immersion of these portions in liquid helium developed no additional fractures.

From the above observations and together with the fact that glass does not plastically deform to any extent and fractures only under tensile stresses, it had been theorized that the breakage was due to a difference in the coefficients of expansion of the various materials employed. By way of example, a soda-lime glass substrate has a coefficient of expansion of $9.2\times10^{-6}$ per ° C. and conventional 60% tin–40% lead solder with a small percentage of silver added thereto has a coefficient of expansion of $25\times10^{-6}$ per ° C. Thus, cooling a solder contact having a diameter of 3/32 inch formed of these materials from room temperature to liquid helium temperature, a change of about 289° C., causes the solder to contract about 0.00067 mil, while the glass beneath it contracts only about 0.00024 mil, a difference of 280%.

Remarkedly, the general purpose superconductive solder of the method of this application exhibits a temperature coefficient of about $30\times10^{-6}$ per ° C., which is about the same as the conventional solder described above, yet does not produce breakage when the contact is cooled to liquid helium temperatures. The reason for this is not yet completely understood, but it appears that the addition of indium in the amount hereinbefore cited produces a lattice slip within the connection, resulting in the tensile stress developed during the several hundred degree centigrade temperature change being relieved, at least partially, within the connection itself, rather than being applied solely to the substrate. By way of example, after repeated immersions in liquid helium, tension applied to the 2 x 10 mil ribbon wire soldered to the thin superconductive film was effective to cause breakage of the wire without imparting damage to the connection.

It should be noted that, although a relatively wide range of metals are listed above as being useful in the method of forming thin film connections operable at low temperatures, the specific example only, has yielded essentially 100% reliability. This appears due to the fact that variations in the constituents of the solder reduces the "wetting" and "lattice slip" properties thereof.

By way of example, more than 100 solders within the range hereinabove specified were tested by repeated immersions of connections formed therefrom in liquid helium. Although no breakage occurred upon one or two immersions, repeated immersions produced fractures in about 20% of the connections. The specific solder, 30% tin, 19% lead, 50% indium, and 1% silver, however, has exhibited no fractures upon 50 or more immersions in liquid helium of several hundred connections. This is a marked distinction to the operation of conventional solders, as presently known, wherein breakage occurs generally upon the first immersion.

While the invention has been particularly shown and described with reference to a preferred embodiment thereof, it will be understood by those skilled in the art that various changes in form and details may be made therein without departing from the spirit and scope of the invention.

What is claimed is:

1. A superconductive solder effective to connect superconductive thin films and operative at a superconductive temperature consisting of 50% indium, 20% lead, and 30% tin, by weight.

2. A superconductive solder effective to connect superconductive thin films to preformed silver lands upon an insulating substrate and operative at a superconductive temperature consisting of 50% indium, 19% lead, 30% tin, and 1% silver.

References Cited by the Examiner

UNITED STATES PATENTS

| | | | |
|---|---|---|---|
| 2,636,820 | 4/53 | Bolton | 75—175 |
| 2,649,368 | 8/53 | Smith | 75—134.8 |
| 2,671,264 | 3/54 | Pessel | 333—39 |
| 2,916,615 | 12/58 | Lundburg | 333—39 |
| 2,964,839 | 12/60 | Marafioti | 29—195 |
| 3,050,683 | 8/62 | Anderson | 333—39 |

OTHER REFERENCES

"Indium Alloys Finding Important Commercial Uses," September 1952.

"Indium Solders," pages 594–596, published Metal Finishing, November 1942.

"Materials and Methods," pages 113–115, by R. J. Jaffee and S. M. Weiss.

DAVID L. RECK, *Primary Examiner.*

WHITMORE A. WILTZ, HYLAND BIZOT, *Examiners.*